United States Patent
Yamagata et al.

(10) Patent No.: US 7,507,642 B2
(45) Date of Patent: Mar. 24, 2009

(54) VAPOR-PHASE GROWTH METHOD, SEMICONDUCTOR MANUFACTURING METHOD AND SEMICONDUCTOR DEVICE MANUFACTURING METHOD

(75) Inventors: Hideo Yamagata, Tokyo (JP); Takeyoshi Koumoto, Tokyo (JP); Kenji Atsuumi, Tokyo (JP); Yoichi Negoro, Tokyo (JP); Tatsushiro Hirata, Tokyo (JP); Takashi Noguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/747,575

(22) Filed: May 11, 2007

(65) Prior Publication Data

US 2007/0287268 A1  Dec. 13, 2007

Related U.S. Application Data

(62) Division of application No. 10/818,821, filed on Apr. 6, 2004, now Pat. No. 7,303,979, which is a division of application No. 10/204,386, filed as application No. PCT/JP01/11203 on Dec. 20, 2001, now Pat. No. 7,157,344.

(30) Foreign Application Priority Data

| Dec. 20, 2000 | (JP) | ............... 2000-387419 |
| Dec. 22, 2000 | (JP) | ............... 2000-390738 |
| Jan. 16, 2001 | (JP) | ............... 2001-007666 |

(51) Int. Cl.
H01L 21/322 (2006.01)
H01L 21/22 (2006.01)
H01L 21/38 (2006.01)

(52) U.S. Cl. ..................... 438/477; 438/565

(58) Field of Classification Search ........... 438/694, 438/706, 704, 680, 565, 477; 257/131
See application file for complete search history.

(56) References Cited

U.S. PATENT DOCUMENTS 5,906,708 A * 5/1999 Robinson et al. ........... 438/694

(Continued)

FOREIGN PATENT DOCUMENTS

EP  484 056  6/1992

(Continued)

OTHER PUBLICATIONS

Japanese Office Action issued on Jun. 12, 2007.

(Continued)

*Primary Examiner*—Davienne Monbleau
*Assistant Examiner*—Monica D Harrison
(74) *Attorney, Agent, or Firm*—Sonnenschein Nath & Rosenthal LLP

(57) ABSTRACT

In a vapor-phase growth method in which a silicon-germanium mixed crystal layer is deposited on a semiconductor substrate, the vapor-phase growth method comprises a first step of introducing silicon raw material gas into a reaction furnace in such a manner that a silicon raw material gas partial pressure increases in proportion to a time to thereby deposit a first semiconductor layer of a silicon layer on the semiconductor substrate under reduced pressure, a second step of introducing silicon raw material gas and germanium raw material gas into the reaction furnace in such a manner that a desired germanium concentration may be obtained to thereby deposit a second semiconductor layer of a silicon-germanium mixed crystal layer on the first semiconductor layer under reduced pressure and a third step of introducing silicon raw material gas into the reaction furnace under reduced pressure to thereby deposit a third semiconductor layer of a silicon layer on the second semiconductor layer. Thus, there can be obtained a semiconductor layer in which a misfit dislocation can be improved.

5 Claims, 12 Drawing Sheets

U.S. PATENT DOCUMENTS 5,909,059 A    6/1999  Hada et al.
6,639,327 B2 * 10/2003 Momoi et al. ............... 257/131

FOREIGN PATENT DOCUMENTS

| JP | 04-106980  | 4/1992  |
|----|------------|---------|
| JP | 04-162431  | 6/1992  |
| JP | 09-181091  | 7/1997  |
| JP | 2001-319935| 11/2001 |
| JP | 2002-026027| 1/2002  |
| JP | 2002-26027 | 1/2002  |

OTHER PUBLICATIONS

EP Communication dated Apr. 25, 2008 for Application No. 01994979.1-2122.

Schaffler, F. et al.: "High-electron-mobility Si/SiGe heterostructures: influence of the relaxed SiGe buffer layer" Semiconductor Science and Technology, vol. 7 No. 2, Feb. 1, 1992, pp. 260-266, XP020031090; IOP, Bristol.

Fitzgerald E. A. et al: "Totally relaxed GeXSil-x layers withlow threading dislocation densities grown on Si substrates" Applied Physics Letters, vol. 59, No. 7; Aug. 12, 1991, pp. 811-813; XP00233762; AIP, American Institute of Physicis, Melville, New York.

* cited by examiner

US 7,507,642 B2

VAPOR-PHASE GROWTH METHOD, SEMICONDUCTOR MANUFACTURING METHOD AND SEMICONDUCTOR DEVICE MANUFACTURING METHOD

RELATED APPLICATION DATA

This application is a divisional of U.S. patent application Ser. No. 10/818,821, filed Apr. 6, 2004, which is a divisional of U.S. patent application Ser. No. 10/204,386, filed Dec. 2, 2002, which is a Sec. 371 National Stage of International Application No. PCT/JP01/11203, filed Dec. 20, 2001, and claims priority to Japanese Application No. P2000-387419, filed Dec. 20, 2000, Japanese Application No. P2000-390738, filed Dec. 22, 2000, and Japanese Patent Application No. P2000-007666, filed Jan. 16, 2001.

BACKGROUND OF THE INVENTION

The present invention relates to a vapor-phase growth method for forming a mixed crystal layer of silicon and germanium, a method of manufacturing a semiconductor having a mixed crystal layer of silicon and germanium and a method of manufacturing a semiconductor device including a suitable transistor such as a heterojunction bipolar transistor which includes a mixed crystal layer of silicon and germanium.

BACKGROUND OF THE INVENTION

In recent years, as the multimedia age in which technologies such as information, service and entertainment are united has come, need for transmitting mass-data at high speed is increasing more. With respect to bipolar transistors, it is also requested that bipolar transistors should become highly-efficient more than before.

In order to enable bipolar transistors to operate at high speed, bipolar transistors need a base layer which should be heavily-doped and which should reduce its film thickness.

However, when a base layer is formed by a prior-art ion implantation technique, due to channeling of implanted impurities, so far it has been difficult to realize a base layer having a base width less than 40 nm.

Therefore, as a step for solving this problem, a heterojunction bipolar transistor (Hetero Bipolar Transistor (hereinafter referred to as a "HBT") which applies a technique for epitaxially depositing a mixed crystal layer of silicon-germanium ($Si_{1-x}Ge_x$ (hereinafter referred to as a "SiGe")) on a silicon (Si) substrate receives a remarkable attention.

Further, in a bipolar transistor, as junction of a base layer becomes shallow, a concentration at which impurities are implanted into the base layer is caused to increase and there arises a problem of how to implant positive holes into the emitter.

However, because the above-mentioned SiGeHBT uses the SiGe layer having a band gap narrower than that of the silicon layer as a base region, a potential barrier is produced between the emitter and the base and implantation of positive holes into the emitter is decreased considerably.

Therefore, resistance of the base layer can be reduced by making the base layer become high in carrier concentration, and further a sufficiently large current amplification factor (hFE) can be obtained. As a consequence, it is possible to realize an excellent high-frequency characteristic while a sufficient withstanding high pressure can be maintained.

Moreover, when profile of germanium is given inclination, a time ($\tau_B$) during which carriers travel through the base layer can be reduced, thereby making it possible to realize a high-speed bipolar transistor having an excellent high-frequency characteristic.

However, since the SiGe mixed crystal layer has different lattice constants of silicon and germanium and different coefficients of thermal expansion of silicon and germanium, stress is produced and there arises a problem in which a crystal defect which is what might be called a misfit dislocation occurs unavoidably.

This misfit dislocation strongly depends upon germanium concentration. Accordingly, if the germanium concentration is decreased, occurrence of crystal defect can be controlled. In this case, however, the effect for reducing the band gap width becomes unsatisfactory and hence the above-mentioned target performance of bipolar transistors cannot be obtained.

In the manufacturing process of the SiGeHBT, it is customary that an SiGe mixed crystal layer is epitaxially deposited on an active region separated by a separation silicon oxide layer formed by LOCOS (Local Oxidation: local silicon oxidation) and simultaneously a polycrystalline SiGe mixed crystal layer is formed on the separation silicon oxide layer.

In this case, since silicon and germanium are different in physical properties, and since stress is produced by LOCOS and stress is produced due to different coefficients of thermal expansion of the silicon oxide layer, silicon and germanium, misfit dislocation tends to occur.

FIG. 13 shows a cross-sectional view of a main portion of a semiconductor device in which an SiGe mixed crystal layer of the SiGeHBT is formed. In this case, on the surface of a single crystal silicon semiconductor substrate 21, there is formed a separation silicon oxide layer 1, formed by LOCOS for separating its active region or separating itself from other element, on which a deposited silicon oxide layer 2, formed by CVD (Chemical Vapor Deposition) technique, and a semiconductor layer 60 having an SiGe mixed crystal layer are deposited by low-temperature epitaxial technique.

The semiconductor layer 60 has a lamination layer structure of a trilayer-structure comprising a silicon buffer layer 61, an SiGe mixed crystal layer 62 and a silicon capping layer 63.

The silicon buffer layer 61 comprises a silicon epitaxial layer deposited in order to smoothen very small concavities and convexities produced on the N⁻ expitaxial layer surface when an opening is formed through a base active region, for example, and a polycrystalline silicon layer deposited in order to form a seed (seed) layer required when a polycrystalline SiGe layer is formed on the separation silicon oxide layer 1 for separating the active region or separating itself from other semiconductor element.

The SiGe mixed crystal layer 62 that has been deposited on this silicon buffer layer 61 is deposited on the single crystal silicon layer of the semiconductor substrate 21 as an SiGe epitaxial layer and is also deposited on the separation silicon oxide layer 1 as a polycrystalline silicon layer.

The semiconductor layer 60 composed of a base in the bipolar transistor, and its portion extended on the separation silicon oxide layer 1 is used as a base electrode lead-out region.

This semiconductor layer 60 is deposited by reduced pressure chemical vapor deposition (RPCVD: Reduced Pressure Chemical Vapor Deposition). This semiconductor layer is deposited by this vapor-phase growth method as follows. While hydrogen gas is being introduced into a reaction furnace of a deposition apparatus, a semiconductor substrate is heated up to approximately 900° and baked by hydrogen for about 5 minutes. Thereafter, under the condition in which the hydrogen gas is being continuously introduced into the reaction furnace, a temperature at which the semiconductor substrate is heated is lowered up to approximately 710° C. to 660° C. and monosilane (SiH$_4$) gas and germane (GeH$_4$) gas which are raw material gases to deposit films and diborane (B$_2$H$_6$) gas which is incombustible gas are supplied to the reaction furnace to epitaxially deposit the target semiconductor layer.

A conventional procedure for depositing films according to a vapor-phase growth method will be described with reference to a time chart of FIG. 14.

First, as shown in FIG. 14A, in order that constant monosilane pressure may become 26.7 Pa (0.2 Torr) at a temperature of approximately 710° C. and at pressure approximately 10,666 Pa (80 Torr) within the reaction furnace, monisilane gas is supplied into the reaction furnace to deposit a silicon epitaxial film having a thickness of approximately 15 nm.

At that time, the buffer layer 61 is deposited on the separation silicon oxide layer 1 as the polycrystalline silicon layer simultaneously.

After the silicon buffer layer 61 has been deposited in this manner, a temperature within the reaction furnace is lowered up to approximately 660° C. and monosilane gas and germane gas are supplied into the reaction furnace while a flow rate of gas is being controlled in such a manner that a desired germanium concentration and a desired film thickness may be obtained. At that time, while a flow rate of diborane gas is being controlled in such a manner that a desired boron profile may be obtained, diborane gas is supplied into the reaction furnace. Thus, there is deposited the SiGe mixed crystal layer 62.

Subsequently, under the condition in which a temperature within the reaction furnace is held at approximately 680° C. and pressure within the reaction furnace is held at approximately 13,332 Pa (100 Torr), monosilane gas and diborane gas are supplied into the reaction furnace to deposit a boron-doped silicon epitaxial layer having a desired film thickness serving as the silicon capping layer 63.

FIG. 15 is a diagram showing magnitudes of shearing stresses obtained based upon differences of coefficients of thermal expansion of respective portions in the cross-section of the portion in which the semiconductor layer 60 is laminated from the single crystal silicon of the semiconductor substrate 21 to the silicon oxide by light and shade. As is clear from this diagram, the shearing stress is concentrated in the area encircled by a solid line a on the silicon oxide at its portion in which the semiconductor layer 60 is formed.

The present invention is to provide a vapor-phase growth method, a semiconductor manufacturing method and a semiconductor device manufacturing method in which the problem of the misfit dislocation produced in the vapor-phase growth method of the semiconductor layer including such SiGe mixed crystal layer can be solved and in which an SiGe epitaxial mixed crystal with excellent crystal quality can be obtained.

Further, in a method of manufacturing a semiconductor device including a bipolar transistor, for example, the present invention is to provide a semiconductor device manufacturing method in which a yield can be prevented from being lowered due to the above-mentioned misfit dislocation when a silicon-germanium epitaxial mixed crystal layer is used as the base of the semiconductor device.

DISCLOSURE OF INVENTION

A first vapor-phase growth method according to the present invention is comprised of first to third steps in a vapor-phase growth method for depositing a silicon-germanium mixed crystal layer on a semiconductor substrate.

First, at the first step, silicon raw material gas is introduced into a reaction furnace in such a manner that a silicon raw material gas partial pressure may increase in proportion to a time, whereby a silicon buffer layer of a first semiconductor layer is deposited on a semiconductor substrate under reduced pressure.

Subsequently, at the second step, silicon raw material gas and germanium raw material gas are introduced into the reaction furnace in such a manner that a desired germanium concentration may be obtained, whereby a second semiconductor layer of a silicon-germanium (SiGe) mixed crystal layer is deposited on the first semiconductor substrate under reduced pressure.

Further, subsequently, at the third step, under reduced pressure, silicon raw material gas is introduced into the reaction furnace, whereby a silicon capping layer of a third semiconductor layer is deposited on the second semiconductor layer of the silicon mixed crystal layer.

In the vapor-phase growth method according to the present invention, since the silicon buffer layer is deposited while the gas partial pressure of the silicon raw material gas is being increased at a constant changing ratio at the first step, it is possible to form the silicon-germanium mixed crystal layer in which occurrence of misfit dislocation produced after the silicon-germanium mixed crystal layer has been formed can be suppressed and which is excellent in crystal quality. In particular, in the active region exposed to the single crystal silicon substrate surface and the portion in which the silicon-germanium mixed crystal layer for the separation silicon oxide for separating this active region is formed, the particle size of seeds of polycrystalline silicon formed on this separation silicon oxide layer as the silicon buffer layer can be reduced. Thus, crystallinity near the interface between the polycrystalline silicon layer and the silicon epitaxial layer formed on the single crystal silicon substrate surface as the silicon buffer layer can be improved and hence occurrence of misfit dislocation can be improved considerably.

A second vapor-phase growth method according to the present invention comprises a vapor-phase growth process in which a semiconductor layer having a silicon-germanium mixed crystal layer is deposited on a semiconductor substrate formed of a single crystal silicon substrate across an active region exposed to the single crystal silicon substrate surface and a separation silicon oxide layer for separating this active region. In a vapor-phase growth method in which this semiconductor layer is formed on the active region as an epitaxial layer and is also formed on the separation silicon oxide layer as a polycrystalline layer, its vapor-phase growth process comprises first, second and third steps for laminating first, second and third semiconductor layers.

Specifically, at the first step, silicon raw material gas and germanium raw material gas are introduced into a reaction furnace to deposit a silicon-germanium epitaxial layer on the active region to which the single crystal silicon substrate surface is exposed. At the same time, the first semiconductor layer is deposited by forming the polycrystalline silicon-germanium layer on the separation silicon oxide layer. At the first step for depositing the film, a polycrystalline silicon-germanium mixed crystal layer having a germanium concentration which can provide the same coefficient of thermal expansion as that of silicon oxide is formed on the first semiconductor layer.

Next, at the second step, at the same time the silicon raw material gas and the germanium raw material gas are introduced into the reaction furnace to deposit the silicon-germanium epitaxial layer on the silicon-germanium epitaxial layer on the active region, the second semiconductor layer is deposited by forming the polycrystalline silicon-germanium layer on the polycrystalline silicon on the separation silicon oxide layer.

At the next third step, at the same time only the silicon raw material gas is introduced into the reaction furnace to deposit the silicon epitaxial layer on the active region to which the silicon-germanium epitaxial layer is exposed, the third semiconductor layer for forming the polycrystalline silicon layer is deposited on the polycrystalline silicon on the separation silicon oxide layer.

In a second vapor-phase growth method according to the present invention, at the first step, at the same time the silicon raw material gas and the germanium raw material gas are introduced into the reaction furnace to deposit the silicon-germanium layer on the active region to which the single crystal silicon substrate surface is exposed, the polycrystalline silicon-germanium layer is formed on the separation silicon oxide layer. Since the silicon-germanium epitaxial layer having the germanium concentration which can provide the same coefficient of thermal expansion as that of the separation silicon oxide layer is formed by the first step, there can be solved the problem of the misfit dislocation which occurs in the vapor-phase growth method of the SiGe mixed crystal layer. Therefore, it is possible to obtain the SiGe epitaxial mixed crystal layer which is excellent in crystal quality.

In a semiconductor manufacturing method according to the present invention, a semiconductor manufacturing method in which a silicon-germanium mixed crystal layer is deposited on a semiconductor substrate formed of a single crystal silicon substrate by vapor-phase growth includes a vapor-phase growth process in which a silicon-germanium epitaxial mixed crystal layer is formed on an active region to which a single crystal silicon substrate surface is exposed and at the same time a polycrystalline silicon-germanium mixed crystal layer is formed on a separation silicon oxide layer formed on the single crystal silicon substrate. This vapor-phase growth process is comprised of the aforementioned first and second vapor-phase growth methods according to the present invention.

Further, a semiconductor device manufacturing method according to the present invention is a method of manufacturing a semiconductor device in which a silicon-germanium mixed crystal layer is formed on a base region of a semiconductor substrate. The process for forming the silicon-germanium mixed crystal layer is comprised of the above-mentioned first and second vapor-phase growth methods according to the present invention.

Then, according to these semiconductor manufacturing method and semiconductor device manufacturing method, as described above, since there are used the inventive vapor-phase growth methods in which the misfit dislocation can be improved, it is possible to manufacture a target semiconductor and a target semiconductor device at high yield.

BEST MODE FOR CARRYING OUT THE INVENTION

Inventive examples of a vapor-phase growth method according to the present invention and a semiconductor manufacturing method and a semiconductor device manufacturing method according to the above vapor-phase growth method will be illustrated and described.

Figure 1:
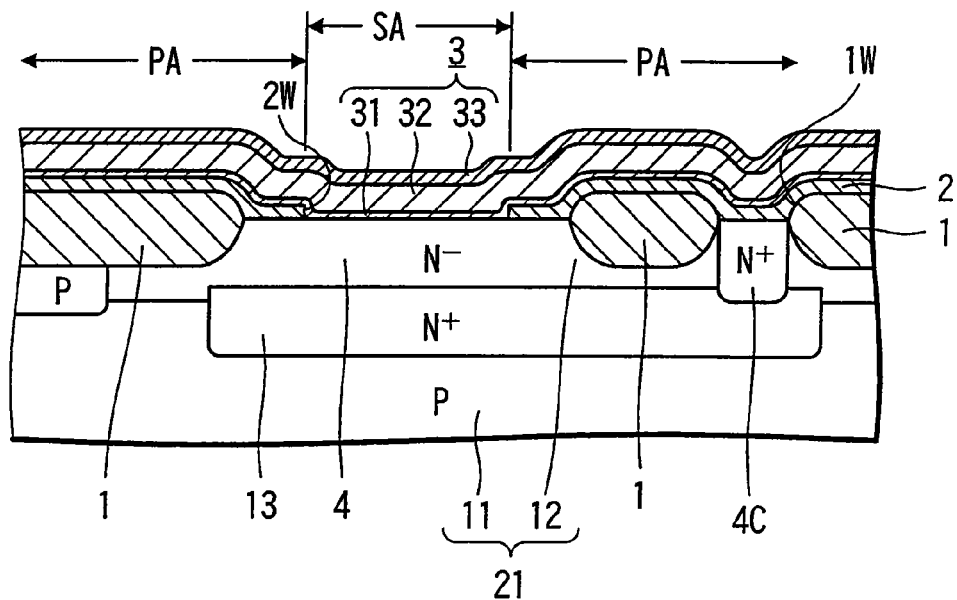
FIG. 1 is a schematic cross-sectional view of a main portion of a semiconductor device to which a vapor-phase growth method and a semiconductor manufacturing method according to the present invention can be applied.
Figure 2:
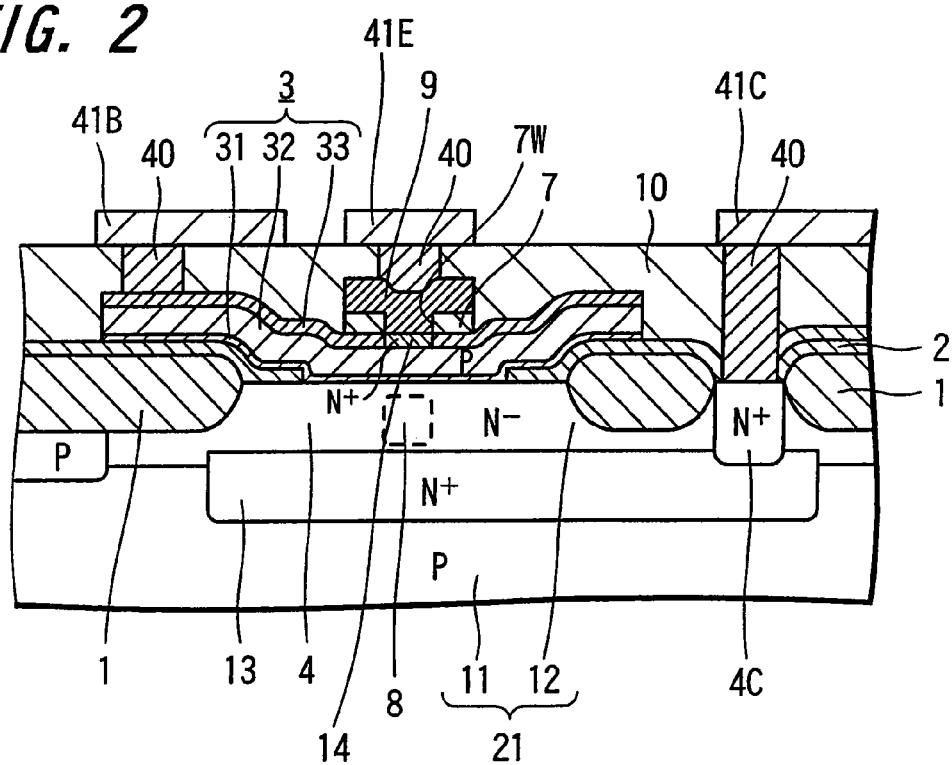
FIG. 2 is a schematic cross-sectional view of a semiconductor device to which a method of manufacturing a semiconductor device according to the present invention can be applied.

FIG. 1 shows a schematic cross-sectional view of a main portion of an example of an NPN type HBT to which there can be applied a vapor-phase growth method and a semiconductor manufacturing method according to the present invention and illustrates the state in which a semiconductor layer comprising a base region is formed. FIG. 2 is a schematic cross-sectional view of an example of an NPN type HBT to which there can be applied a method of manufacturing a semiconductor device according to the present invention. However, the methods according to the present invention are not limited to these examples and may be applied to PNP type arrangements and various structures.

In this arrangement, the transistor includes a single crystal silicon semiconductor substrate 21 in which an N type epitaxial semiconductor layer 12 having a low impurity concentration comprising a collector operation region 4 of the HBT is deposited on one major surface of a P type single crystal silicon substrate 11.

Before the epitaxial semiconductor layer 12 is deposited, $Sb_2O_3$ solid source diffusion causes N type impurities to be introduced into the limited region of the substrate 11 to form an N type collector embedding region 13 having a high impurity concentration on the substrate 11 of the semiconductor substrate 21.

On the surface of the semiconductor substrate 21, i.e., on the surface of the epitaxial semiconductor layer 12, there is formed a separation silicon oxide layer 1 for separating an active region of the semiconductor substrate 21, in this example, a region comprising an HBT operation portion from other portions by LOCOS.

This separation silicon oxide layer 1 has an opening portion 1W located at one portion of the collector embedding region 13. An N type collector electrode lead-out region 4C having a high impurity concentration is formed under this opening portion 1W by a suitable method such as ion implantation.

A deposited silicon oxide layer 2 is deposited on the whole surface of the semiconductor substrate 21 by CVD using tetraethoxysilane (TEOS) as raw material gas. Then, this deposited silicon oxide layer 2 is made dense by heat treatment.

An opening portion 2W is limitedly formed on the collector operation region 4 of the deposited silicon oxide layer 2 by photolithography, RIE (Reactive Ion Etching) or wet etching.

Next, organic materials and the like that have stuck to the semiconductor substrate surface exposed through this opening portion 2W are removed. In this removal of organic materials, organic materials are removed by rinsing using mixture cleaning solution of sulfuric acid and hydrogen peroxide solution which have been heated up to a predetermined temperature, for example.

Next, dusts, i.e., so-called particles are removed from the surface of the semiconductor substrate 21. The particles are removed by rinsing using mixture cleaning solution of ammonia and hydrogen peroxide solution which have been heated up to a predetermined temperature, for example.

Further, metal pollutants and natural oxide films are removed from the semiconductor substrate. In this removal of metal pollutants and natural oxide films, they are removed from the semiconductor substrate by rinsing using dilute hydrofluoric acid hydrogen mixture cleaning solution. When metal pollutants and natural oxide films are rinsed by dilute hydrofluoric acid hydrogen mixture cleaning solution, dangling bonds on the surface of the exposed surface of the epitaxial layer 12 are terminated by a hydrogen passivation treatment using hydrogen.

On the semiconductor substrate 21 that has been so far rinsed, there is deposited a semiconductor layer 3 having an SiGe mixed crystal layer from the single crystal silicon substrate exposed through the above-mentioned opening portion 2W to the separation silicon oxide layer or the deposited silicon layer 2 deposited on the separation silicon layer by a vapor-phase growth method according to the present invention.

[First Vapor-phase Growth Method and Semiconductor Manufacturing Method]

In this case, as a first step, silicon raw material gas is introduced into a vapor-phase reaction furnace in such a manner that silicon raw material gas partial pressure may increase in proportion to a time. Then, under reduced pressure, a first semiconductor layer 31 of a silicon buffer layer is formed on the semiconductor substrate.

Subsequently, as a second step, silicon raw material gas and germanium raw material gas are introduced into the vapor-phase reaction furnace in such a manner that a desired germanium concentration may be obtained. Then, under reduced pressure, a second semiconductor layer 32 of an SiGe mixed crystal layer is formed on the first semiconductor layer 31.

Further, as a third step, under reduced pressure, silicon raw material gas is introduced into the vapor-phase reaction furnace and a silicon capping layer of a third semiconductor layer 33 is formed on the SiGe mixed crystal layer of the second semiconductor layer 32.

In this manner, there is formed the laminating semiconductor layer 3 comprising the first, second and third semiconductor layers 31, 32 and 33.

At the first step in the above-mentioned vapor-phase growth method, it is desired that silicon raw material gas partial pressure required when the deposition of layers is started should fall within a range of 1.33 to 8 Pa and that silicon raw material gas partial pressure required when the deposition of layers is ended should fall within a range of 5.33 to 32 Pa.

The laminating semiconductor layer 3 that has been deposited as described above, i.e., the first, second and third semiconductor layers 31, 32 and 33 are deposited as an epitaxial layer region, i.e., a single crystal semiconductor layer region SA on the active region exposed to the single crystal silicon surface of the semiconductor substrate 21 and are also deposited as a polycrystalline semiconductor layer region PA in the region lying across the separation silicon oxide layer or the deposited silicon oxide layer 2.

Monosilane gas can be used as the above-mentioned silicon raw material gas and germane gas can be used the germanium raw material gas.

Further, the laminating semiconductor layer 3 including this SiGe mixed crystal layer is formed at a temperature ranging of from 600° C. to 750° C.

Then, in the second and third steps, P type or N type impurities are introduced. In the NPN type HBT shown in FIG. 1, P type impurities are introduced.

The examples of the first vapor-phase growth method and the first semiconductor manufacturing method according to the present invention will be described more in detail.

[Examples of the First Vapor-phase Growth Method and the First Semiconductor Manufacturing Method]

In this case, the semiconductor substrate 1 from which the above-mentioned organic materials, i.e., the particles and the natural oxide films had been removed is carried into a load-lock chamber having vacuum evacuation function and evacuated over a predetermined time. Subsequently, the semiconductor substrate is carried into a reaction furnace connected to the load-lock chamber without being exposed to the air.

While hydrogen gas is being introduced into this reaction furnace, the semiconductor substrate is heated up to approximately 900° C. and baked by hydrogen for approximately 5 minutes.

Thereafter, while the hydrogen gas is continued to be introduced into the reaction furnace, the above heating temperature is decreased up to approximately 680° C.

Figure 3A:
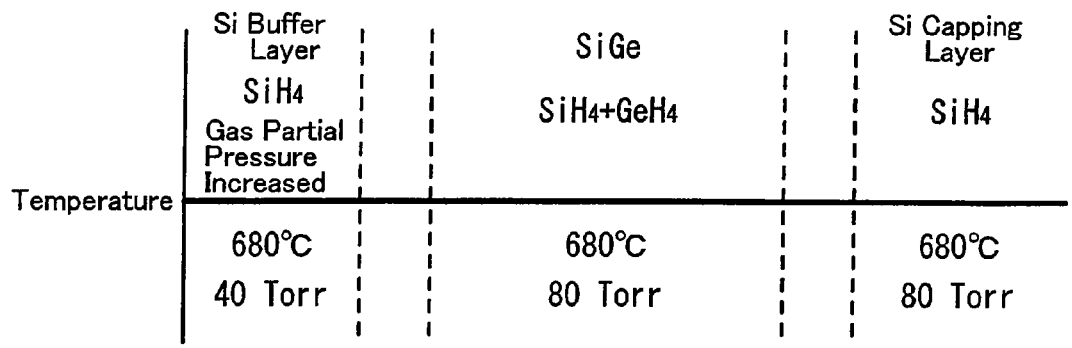
FIG. 3A is a time chart showing a film deposition procedure of an example of a vapor-phase growth method according to the present invention.
Figure 3B:
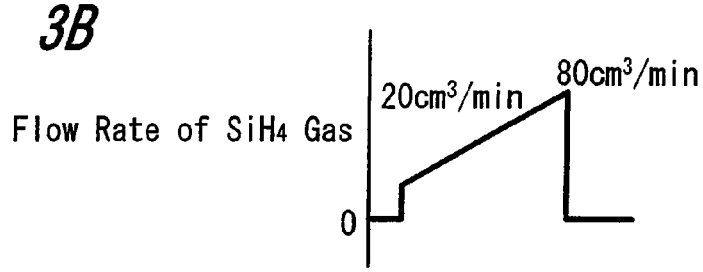
FIG. 3B is a diagram to which reference will be made in explaining a gas flow rate.

Thereafter, as FIG. 3A shows a time chart of a procedure in which films are deposited, as a first step, while the temperature within the reaction furnace is being kept at 680° C., pressure is set to approximately 5,333 Pa (40 Torr) and a flow rate of hydrogen gas is being held at 20,000 $cm^3$/min, monosilane ($SiH_4$) gas is started to be introduced into the reaction furnace as the silicon raw material gas. Then, as shown in FIG. 3B, the flow rate of monosilane gas is progressively increased from 20 $cm^3$/min to 80 $cm^3$/min. Monosilane partial pressure obtained at that time is 5.33 Pa (0.04 Torr) when the introduction of monosilane gas is started and is 21.3 Pa (0.16 Torr) when the deposition of layers is ended. The monosilane pressure is increased at a constant ratio during a time period of about 76 seconds. In this manner, there is formed the first semiconductor layer 31, i.e., silicon buffer layer having a thickness of approximately 15 nm.

Next, as a second step, while a temperature within the reaction furnace is being kept at approximately 680° C., the pressure within the reaction furnace is set to approximately 10,666 Pa (80 Torr) and monosilane ($SiH_4$) gas serving as the silicon raw material gas and germanium ($GeH_4$) gas serving as the germanium raw material gas are supplied to the reaction furnace during a gas flow rate is being controlled in such a manner that a desired germanium concentration and a desired film thickness may be obtained.

At that time, while a flow rate of diborane gas of impurity boron raw material gas is being controlled in such a manner that a desired P type impurity concentration profile may be achieved, diborane gas is introduced into the reaction furnace to deposit the second semiconductor layer 32 of the P type SiGe mixed crystal, for example.

Subsequently, as a third step, while a temperature within the reaction furnace is set to approximately 680° C. and the pressure within the reaction furnace is being held at approximately 10,666 Pa (80 Torr), monosilane gas and diborane gas are introduced into the reaction furnace to deposit the silicon capping layer of the third semiconductor layer 33.

In this manner, there is formed the laminating semiconductor layer 3 in which the first, second and third semiconductor layers 31, 32 and 33 are laminated with each other.

Characteristics of the first vapor-phase growth method according to the present invention will be described in contrast with the conventional method. The characteristics of the method according to the present invention lie in the method in which the first semiconductor layer 31, i.e., the silicon buffer layer is deposited at the first step.

Figure 14A:
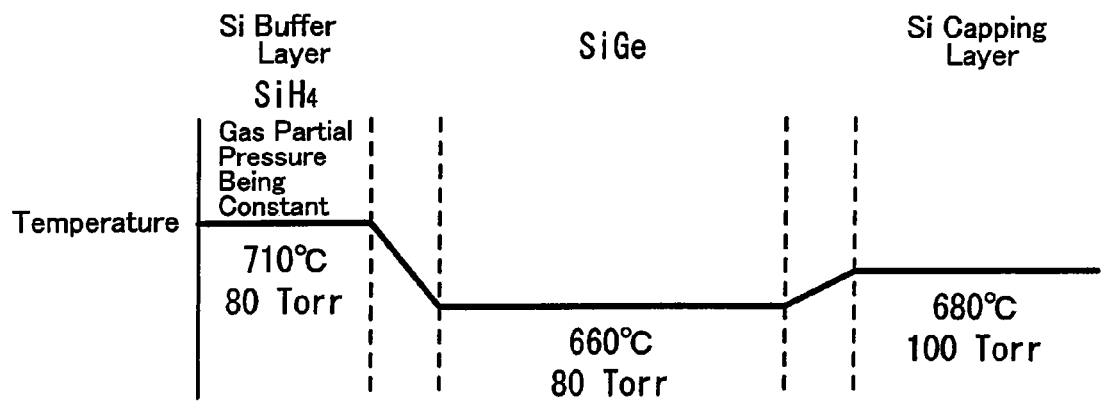
FIG. 14A is a time chart showing a film deposition procedure of a vapor-phase growth method according to the prior-art method.
Figure 14B:
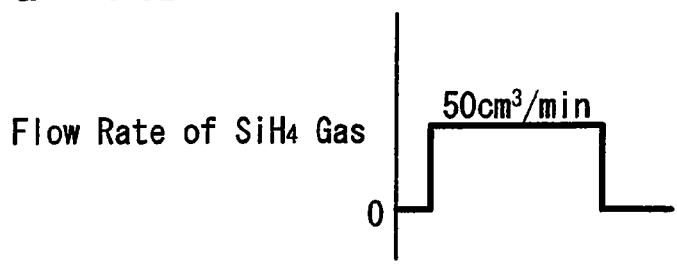
FIG. 14B is a diagram to which reference will be made in explaining a gas flow rate.
Figure 15:
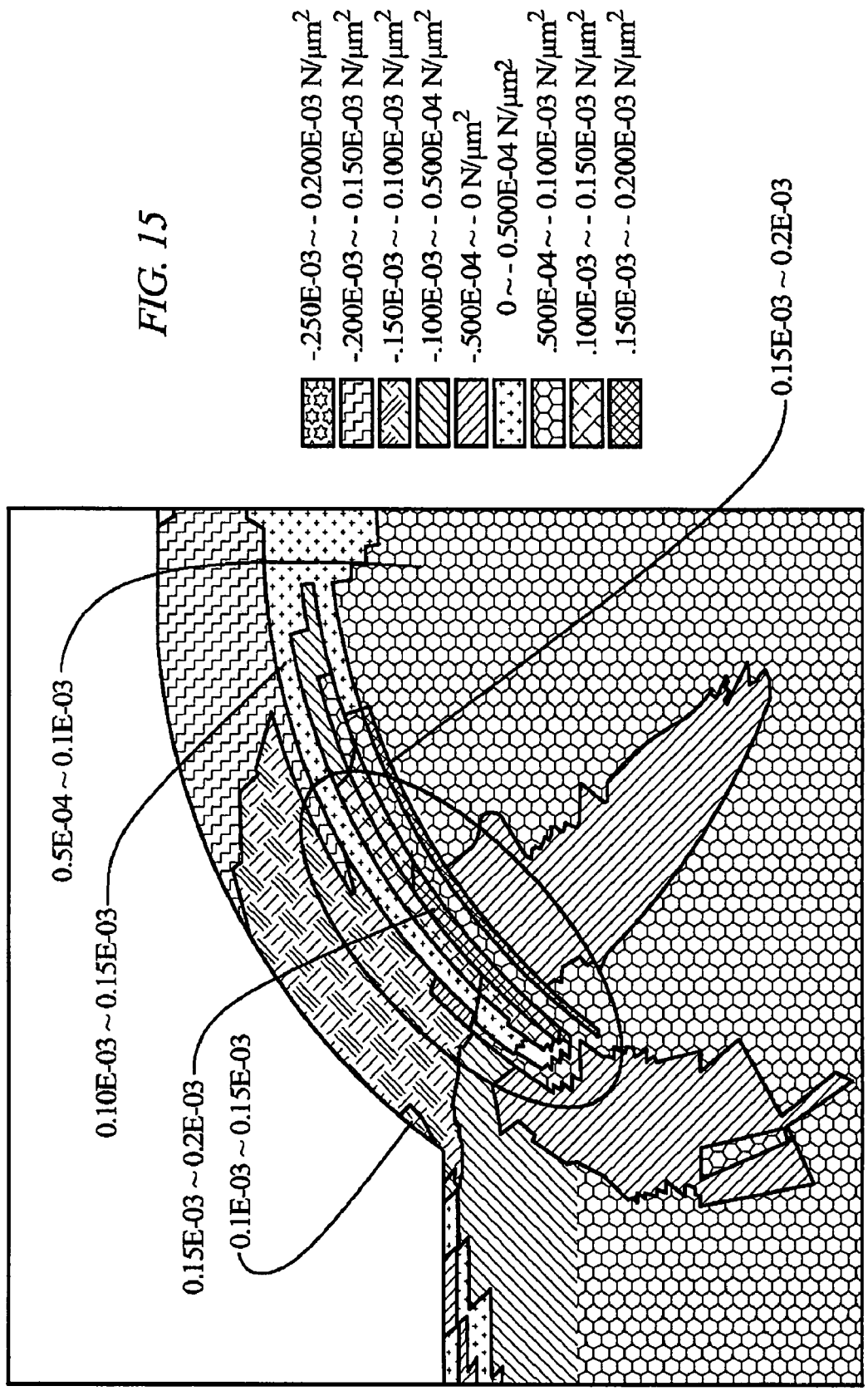
FIG. 15 is a diagram showing the manner in which shearing stress is concentrated.

Specifically, according to the conventional film deposition method, as shown in FIG. 14B, the silicon buffer layer is deposited under the condition in which the flow rate of silicon raw material gas supplied to the reaction furnace, e.g., monosilane ($SiH_4$) gas is made constant and in which the silicon raw material gas partial pressure is made constant.

On the other hand, in the above-mentioned method according to the present invention, under the condition in which the flow rate of silicon raw material gas is being increased at a constant ratio and in which the silicon raw material gas partial pressure is being increased at a constant ratio, there is deposited the first semiconductor layer 31 of the silicon buffer layer. At that time, the monosilane gas partial pressure should preferably be started to be increased from the state of 1.33 Pa (0.01 Torr) to 8 Pa (0.06 Torr), for example, and this partial pressure is increased at a constant ratio. Then, the monosilane gas partial pressure that has been increased and obtained at the end of the film deposition should preferably fall within a range of from 5.33 Pa (0.04 Torr) to 32 Pa (0.24 Torr). Temperature within the reaction furnace can be selected in a range of from 600° C. to 750° C.

Figure 4A:
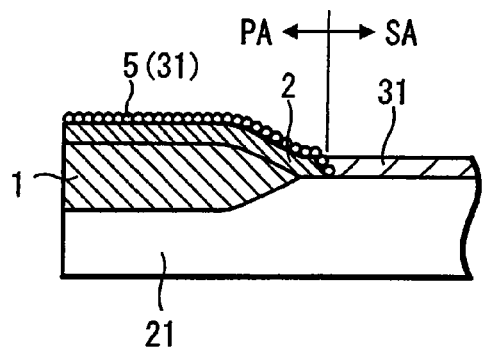
FIGS. 4A and 4B are schematic diagrams showing polycrystalline seeds obtained by a vapor-phase growth method according to the present invention and a vapor-phase growth method according to the prior art.

According to the method of the present invention in which the first semiconductor layer is deposited under such conditions, as schematically shown in FIG. 4A, a polycrystalline silicon seed 5 of the semiconductor layer 31 deposited on the separation silicon oxide layer 2 is decreased in particle size. Therefore, in this case, a boundary portion between the first semiconductor layer 31 in the epitaxial region SA which has been epitaxially deposited on the single crystal silicon of the semiconductor substrate 21 and the polycrystalline semiconductor layer 31 on the silicon oxide layer can become smooth so that crystallinity near this boundary portion becomes excellent.

Figure 4B:
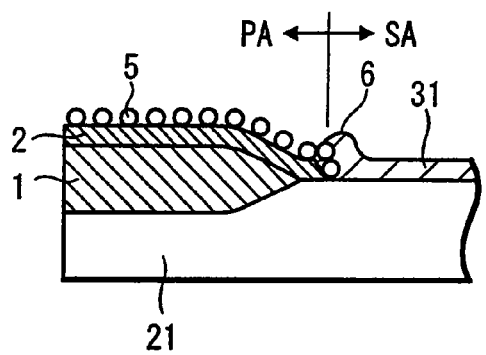

In contrast therewith, according to the conventional method, as shown in FIG. 4B, since the polycrystalline seed 5 becomes large in particle size, a discontinuous portion 6 is produced at the boundary portion between the polycrystalline region PA and the epitaxial region SA so that crystallinity near this boundary portion is degraded.

[First Semiconductor Device Manufacturing Method]

In the first semiconductor device manufacturing method according to the present invention, there can be obtained a target semiconductor device with application of the above-mentioned vapor-phase growth method and the semiconductor manufacturing method according to the present invention.

[Example of the First Semiconductor Device Manufacturing Method]

This example describes the case in which the HBT device shown in FIG. 2 is manufactured. In FIG. 2, parts identical to those of FIG. 1 are denoted by identical reference numerals and therefore need not be described.

In this case, a base semiconductor layer comprising a base region of a finally formed HBT and its electrode lead-out portion are constructed by effecting patterning such as RIE using photolithography on the laminating semiconductor layer 3 that has been deposited by the method according to the present invention described so far with reference to FIG. 1.

Then, an insulating layer 7 of a silicon oxide layer is formed on the whole surface by CVD, for example, and is made dense by heat treatment. Thereafter, a predetermined pattern is made by patterning using photolithography and, at the same time, an opening portion 7W is formed at the semiconductor layer 3 at its portion where the emitter should be formed.

Then, an SIC (Selectively Ion implanted Collector) region 8 which can cancel base impurities on the collector side each other out is formed by implanting ions of phosphor of N type impurities, for example, through this opening portion 7W, whereby the base width can be avoided from being increased due to diffusion of impurity and the base width can be decreased.

Subsequently, an N type polycrystalline silicon semiconductor layer is deposited on the whole surface through the opening portion 7W by CVD, and an emitter semiconductor layer 9 is formed on the opening portion 7W and around this opening portion by patterning using photolithography. This semiconductor layer 9 is formed as an N type emitter semiconductor layer having a high concentration by implanting ions of arsenic (As), for example.

Thereafter, by heat treatment, As is diffused from the emitter semiconductor layer 9 to the semiconductor layer 3, whereby an emitter region 14 is formed. At the same time, respective impurities are activated.

An insulating layer 10 is formed on the whole surface so as to cover the emitter semiconductor layer 9 by CVD based upon TEOS, for example. Opening portions are formed through the emitter semiconductor layer 9, the insulating layers 10, 7, 2 or the like on the polycrystalline region serving as the base electrode lead-out region of the semiconductor layer 3 and the respective portion of the collector electrode lead-out region 4C, respectively. Conductive plugs 40 made of a suitable material such as tungsten (W), for example, are filled into these opening portions, and an Al alloy conductive layer, for example, is formed on the whole surface of the planarization insulating layer 10. Respective electrode interconnections 41E, 41B and 41C for emitter, base and collector which are to be coupled to the respective conductive plugs 40 are formed by patterning using photolithography.

In this manner, there can be obtained the target HBT semiconductor device.

Figure 5:
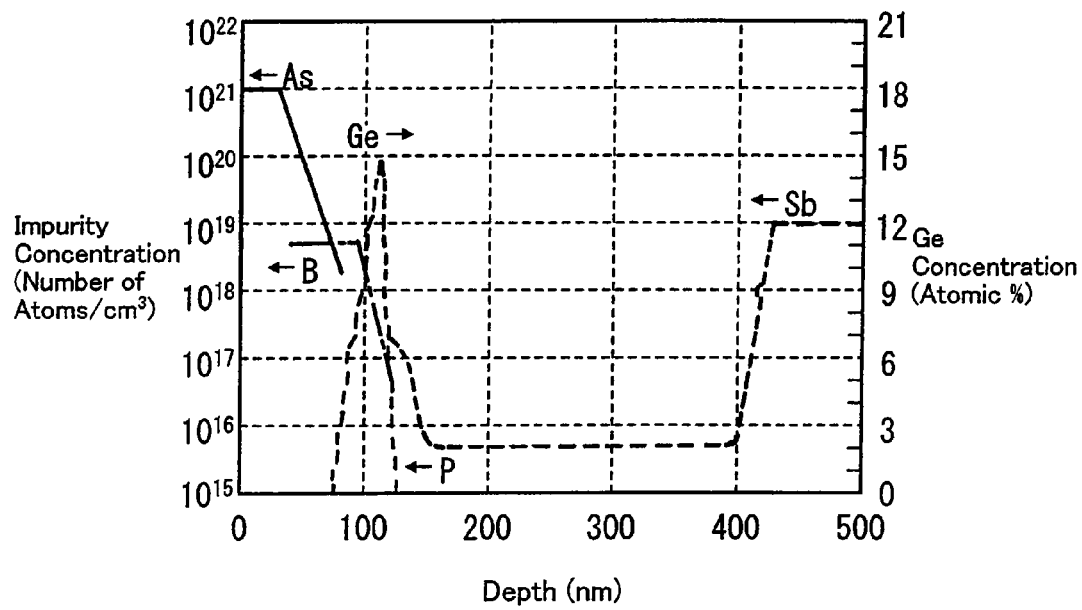
FIG. 5 is a diagram showing impurity concentration of a depth direction of a semiconductor layer according to a method of the present invention and a Ge concentration distribution.

FIG. 5 is a diagram showing an example of an impurity concentration distribution with respect to the depth direction from the $N^+$ emitter layer 9 side of this NPN type HBT and in which a right-hand side vertical axis shows Ge concentration and a left-hand side vertical axis shows As, B, P, Sb concentrations of respective impurities.

Figure 6:
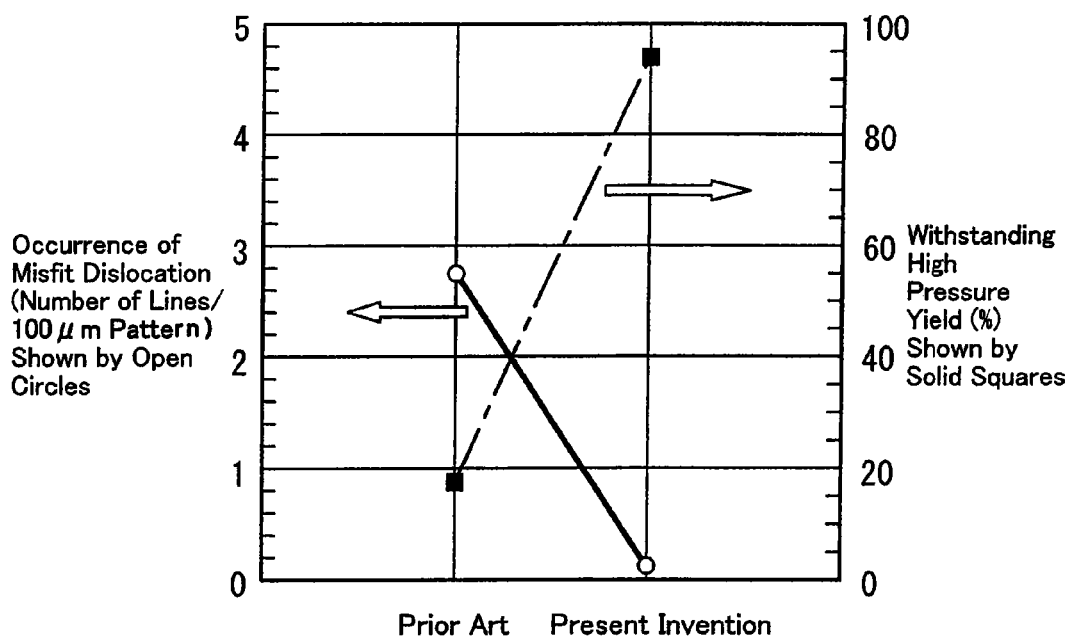
FIG. 6 is a diagram showing amounts of misfit dislocations and withstanding high pressure yields obtained by a method according to the present invention and a method according to the prior art.

FIG. 6 is a diagram showing measured results obtained when occurrences of misfit dislocation of SiGe mixed crystal epitaxial growth in the case of the conventional method that has been described so far with reference to FIG. 14 and in the case of the above-mentioned method of the present invention are plotted by open circles. Withstanding high pressure yields are plotted by solid squares.

A study of FIG. 6 reveals that, according to the method of the present invention in which the gas partial pressure of the silicon raw material gas is increased at a constant changing ratio and the silicon buffer layer is deposited at the first step, the occurrence of misfit dislocation can be decreased considerably and that the withstanding high pressure yield can be improved remarkably.

[Second Vapor-phase Growth Method and Semiconductor Manufacturing Method]

Next, a second vapor-phase growth method according to the present invention and a second semiconductor manufacturing method according to the present invention in which this vapor-phase growth method can be applied to a vapor-phase growth process of a semiconductor layer will be described.

Also in this case, the silicon-germanium epitaxial mixed crystal layer is formed on the active region to which the single crystal silicon substrate surface is exposed. At the same time, the polycrystalline silicon-germanium layer is formed on the separation silicon oxide layer formed on the single crystal silicon substrate and the silicon oxide layer.

Then, also in this case, the method according to the present invention includes the first step of depositing the first semiconductor layer 31, the second step of depositing the second semiconductor layer 32 and the third step of depositing the third semiconductor layer 33.

Then, according to this method, at the first step, at the same time silicon raw material gas and germanium raw material gas are introduced into the reaction furnace to form the silicon-germanium epitaxial layer on the active region to which the single crystal silicon substrate surface is exposed, the first semiconductor layer 31 formed of the polycrystalline silicon-germanium layer is deposited on the separation silicon oxide layer.

In the second step, at the same time silicon raw material gas and germanium raw material gas are introduced into the reaction furnace to form the silicon-germanium epitaxial layer at the portion in which the film is directly deposited on the active region, the polycrystalline silicon-germanium layer is formed on the separation silicon oxide layer, thereby resulting in the second semiconductor layer 32 being deposited.

In the third step, at the same time only silicon raw material gas is introduced into the reaction furnace to form the epitaxial layer on the silicon-germanium epitaxial layer of the second semiconductor layer 32, there is deposited the third semiconductor layer 33 in which the polycrystalline silicon layer is formed on the polycrystalline silicon-germanium layer on the separation silicon oxide layer.

Then, when the first semiconductor layer 31 is deposited at the above-mentioned first step, there is formed the epitaxial layer of the polycrystalline silicon-germanium layer having the germanium concentration which can provide the same coefficient of thermal expansion as that of the silicon oxide.

The germanium concentration in the epitaxial layer of the first semiconductor layer deposited at the first step falls within a range of 7±2 atom %, and this germanium concentration is made constant with respect to the thickness direction of the epitaxial layer.

In order to form a semiconductor layer having excellent crystallinity, it is desired that the film thickness of the epitaxial layer of the first semiconductor layer 31 deposited at the first step should fall within a range of from 5 nm to 30 nm.

Also in this case, monosilane gas can be used as the silicon raw material gas, and germane gas can be used as the germanium raw material gas.

Further, the laminating semiconductor layer 3 including this SiGe mixed crystal layer is formed at a temperature ranging from 600° C. to 750° C.

Then, at the second and third steps, P type or N type impurities are introduced.

[Examples of Second Vapor-phase Growth Method and Second Semiconductor Manufacturing Method]

Also in this case, the semiconductor substrate 1 from which the above-mentioned organic materials, i.e., particles have been removed and the natural oxide films have been removed is carried into the load-lock chamber having vacuum evacuation function, in which it is evacuated over a predetermined time period. Subsequently, the semiconductor substrate is carried into the reaction furnace connected to the load-lock chamber without being exposed to the air.

While hydrogen gas is being introduced into this reaction furnace, the semiconductor substrate is heated up to approximately 900° C. and baked by hydrogen for approximately 5 minutes.

Figure 7A:
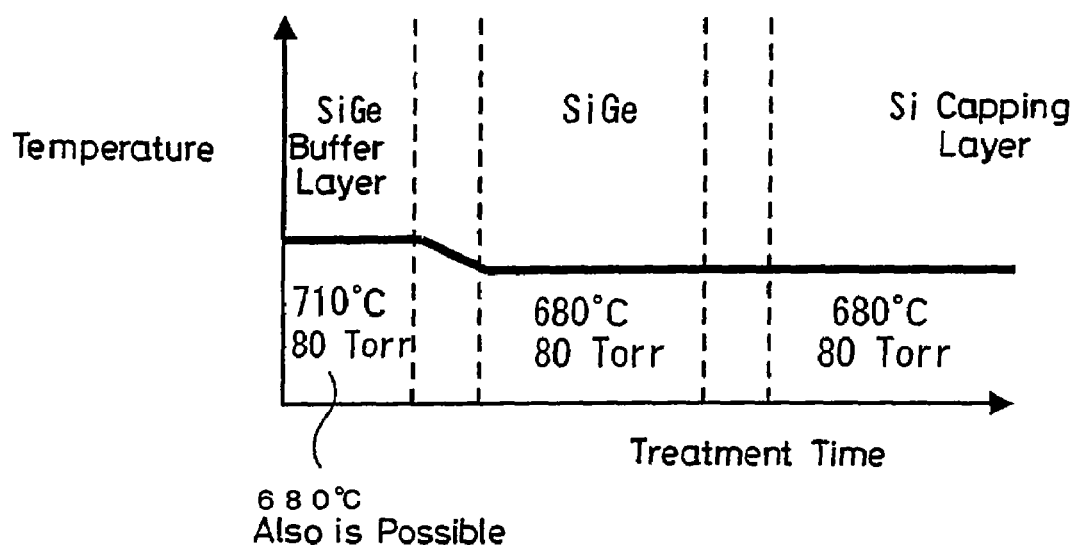
FIG. 7A is a time chart showing a film deposition procedure of an example of a vapor-phase growth method according to the present invention.

Thereafter, while the hydrogen gas is continued to be introduced into the reaction furnace, as FIG. 7A shows a time chart of a procedure in which layers are deposited, a heating temperature is lowered up to approximately 710° C., for example, or 680° C. and an SiGe buffer layer is formed at the first step.

As this first step, while a temperature within the reaction furnace is being held at approximately 710° C., pressure within the reaction furnace is being held at approximately 10,666 Pa (80 Torr) and hydrogen gas is being held at the constant state of 20 SLM, monosilane gas of 20 sccm and germane gas are supplied to the reaction furnace to deposit the SiGe buffer layer of the first semiconductor layer 31. At that time, when this buffer layer is deposited, the above-mentioned gases are introduced into the reaction furnace until the Ge concentration in this deposited semiconductor layer 31 reaches 7.75 atom % and a film thickness becomes 15 nm.

The temperature within the reaction furnace at the first step can be changed to a temperature required at the next second step, e.g., approximately 680° C.

Subsequently, as the second step, the temperature within the reaction furnace is set to 680° C. and monosilane gas and germane gas are supplied into the reaction furnace in such a manner that a desired germanium concentration may be obtained and a desired film thickness may be obtained, whereby the second semiconductor layer 32 of the SiGe layer is formed. At that time, by controlling the flow rate of diborane gas, for example, in such a manner that a desired impurity, e.g., P type boron concentration profile may be obtained, diborane gas is supplied into the reaction furnace.

Next, as the third step, while the temperature within the reaction furnace is similarly being held at approximately 680° C., monosilane gas and diborane gas are supplied into the reaction furnace to deposit the third semiconductor layer 33 formed of the boron-doped silicon layer having a desired film thickness.

In this manner, there is deposited the semiconductor layer 3 shown in FIG. 1, for example.

Figure 7B:
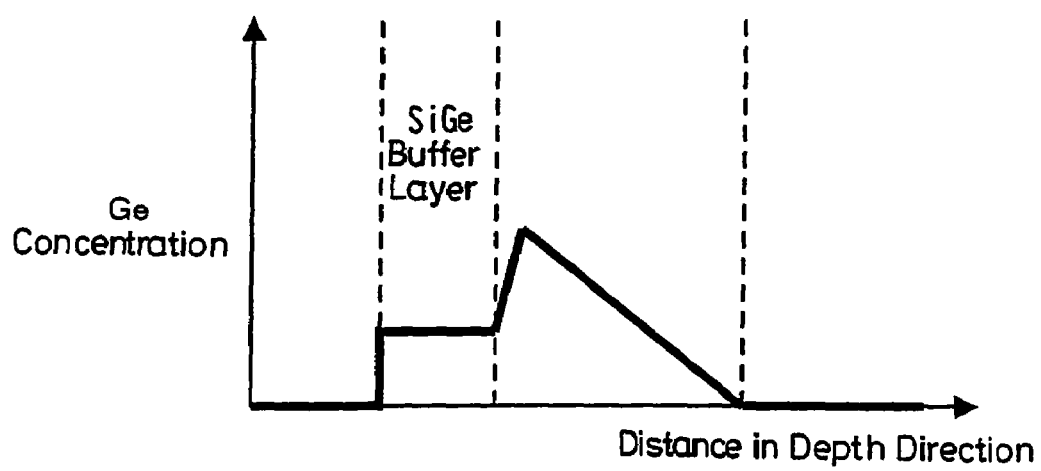
FIG. 7B is a diagram showing a Ge concentration distribution obtained along the depth direction of a semiconductor layer.

FIG. 7B is a diagram showing a Ge concentration distribution obtained when concentrations in the depth direction of the semiconductor layer 3 thus deposited by this method are measured.

In the laminating semiconductor layer 3 comprised of the first to third semiconductor layers 31 to 33 thus deposited by the above-mentioned method according to the present invention, since the first semiconductor layer 31 serving as the buffer layer is formed as the SiGe mixed crystal layer and its Ge concentration is set to approximately 7.75%, stress produced within the opening portion 2W of the silicon oxide layer 2 and stress produced in the semiconductor layer 3 near the opening portion 2W other than the opening portion 2W could be decreased.

The reason for this is that the coefficient of thermal expansion can made substantially coincident with that of the silicon oxide by setting the Ge concentration in the first semiconductor substrate 1 to 7.75 atom % so that the occurrence of stress caused by a difference between these coefficients of thermal expansion can be suppressed.

Thus, the occurrence of misfit dislocation can be suppressed.

Figure 8:
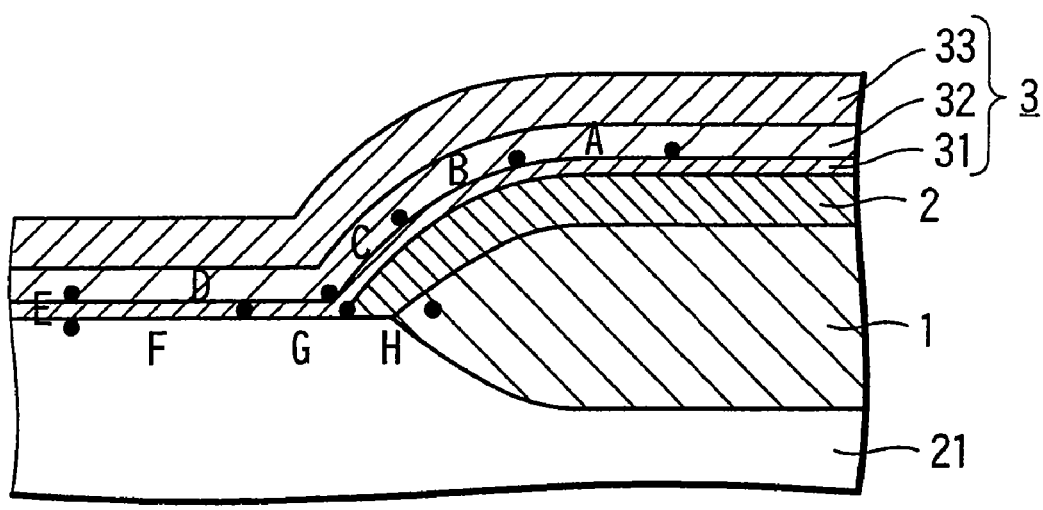
FIG. 8 is a cross-sectional view of a film deposited portion of a semiconductor layer and to which reference will be made in explaining stress.
Figure 9A:
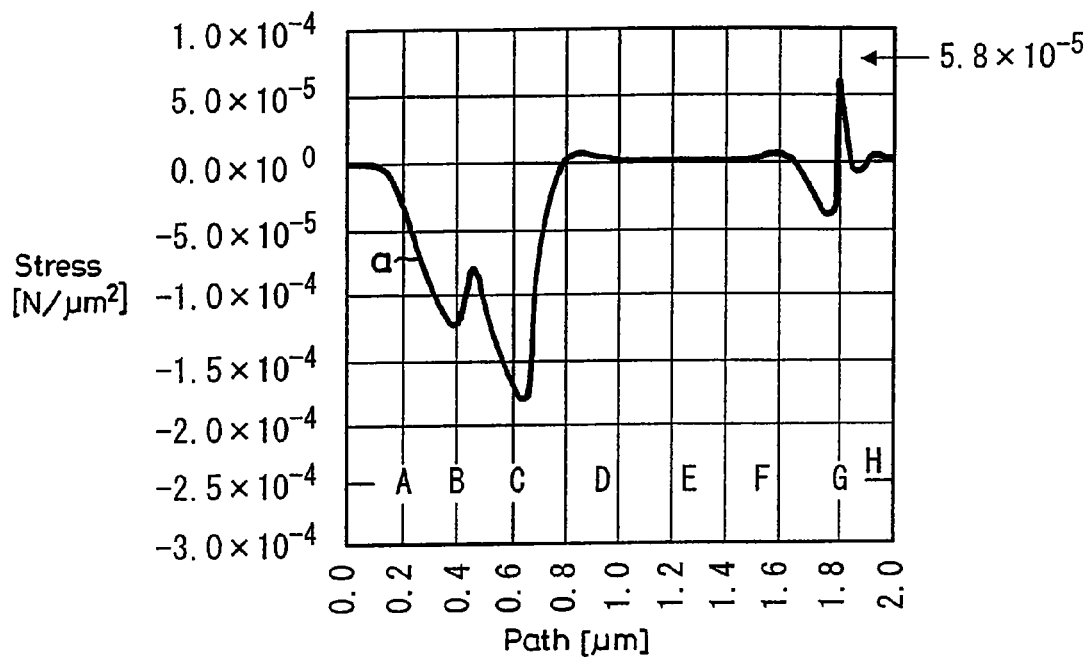
FIGS. 9A and 9B are diagrams showing stresses obtained by the present invention and the prior art.
Figure 9A:
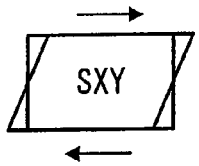

FIG. 8 is a cross-sectional view showing the laminating semiconductor layer 3 comprised of the first, second and third semiconductor layers 31, 32 and 33 which have been so far deposited by the second vapor-phase growth method according to the present invention. FIG. 9A shows results obtained when stresses at respective points A to H shown in FIG. 8 are measured through simulation.

Figure 9B:
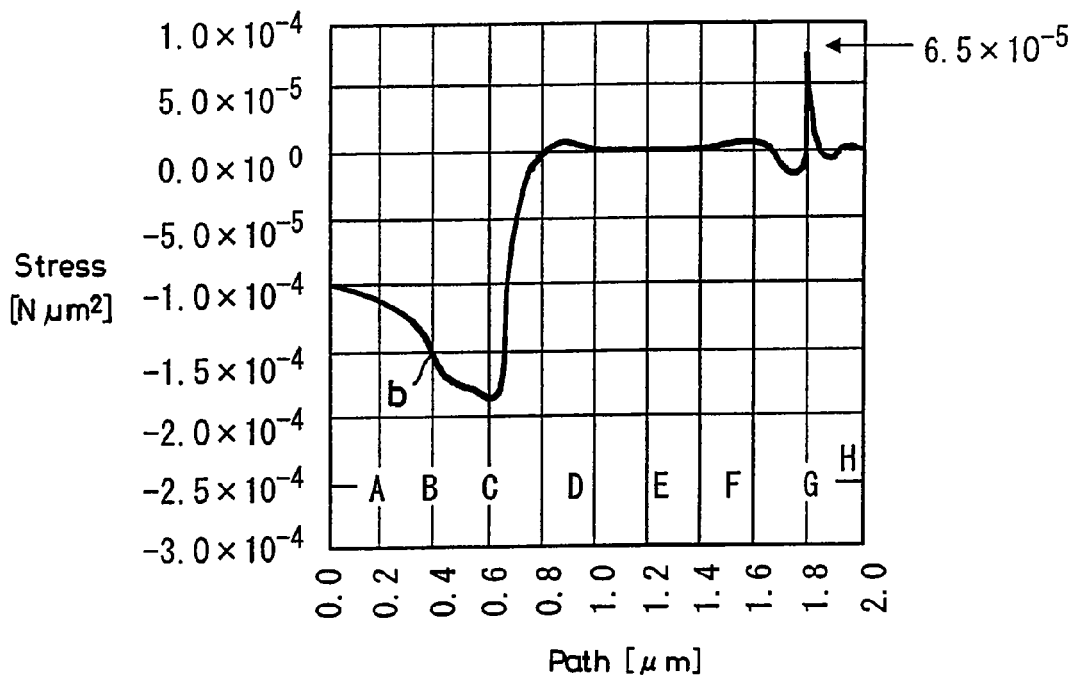
Figure 16A:
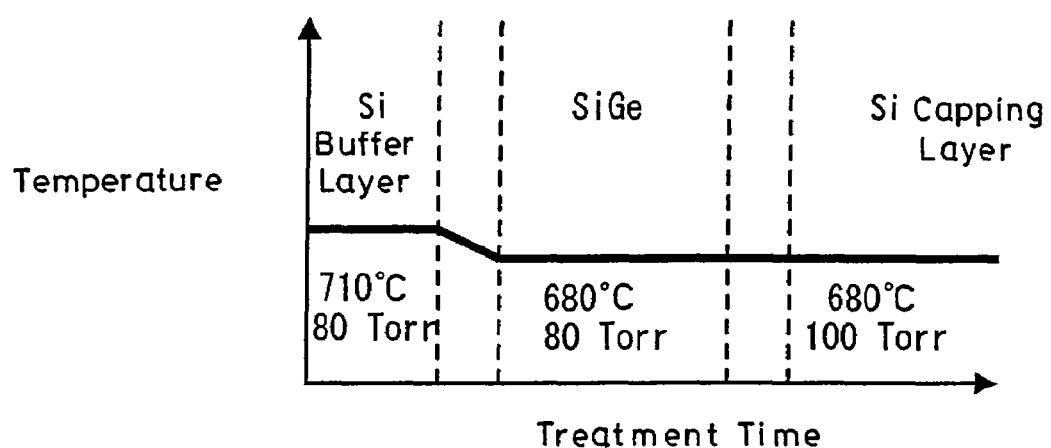
FIGS. 16A and 16B are a time chart showing a film deposition procedure of a vapor-phase growth method according to the prior-art method and a diagram showing a Ge concentration distribution.
Figure 16B:
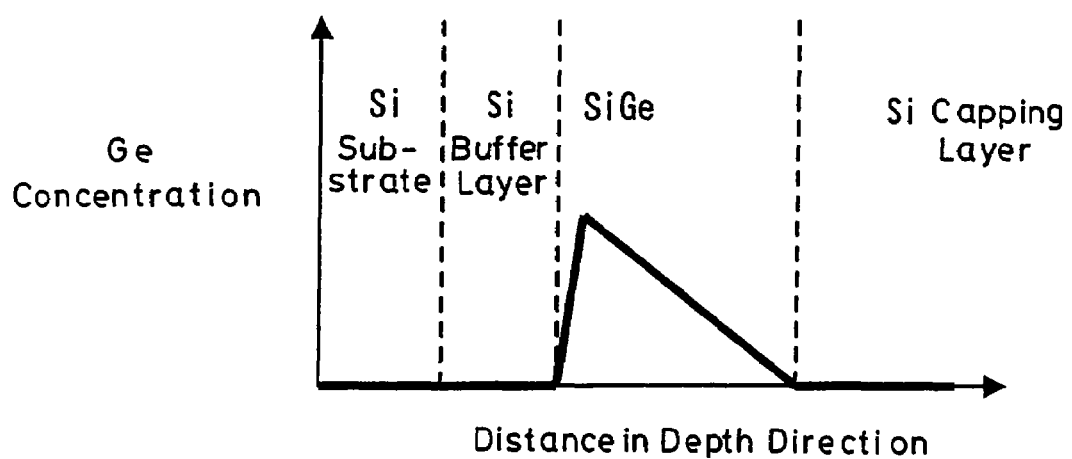

FIG. 9B shows results obtained when stresses at the similar respective positions A to H are measured through simulation in the vapor-phase growth semiconductor layer whose time chart is shown in FIG. 16A and in which the Si layer is used as the first semiconductor layer 31 and formed by the conventional method and in which the Ge concentration in the depth direction includes the distribution shown in FIG. 16B.

In FIGS. 9A and 9B, the horizontal axis represents a distance (μm) from the starting point of the point A to the ending point of the point H, and the vertical axis represents a synthesized difference stress (N/μm$^2$) of two directions which are perpendicular to each other. Further, plus sign and minus sign of the difference stresses corresponds to directions of vectors of difference stresses.

In FIGS. 9A and 9B, it is to be understood that the difference stress has a plus peak near the boundary between the points F and G near the edge of the above-mentioned opening portion 2W to which the active region is exposed.

While the conventional method represents a difference stress of approximately $6.5 \times 10^{-5}$ (N/μm$^2$) as shown in FIG. 9B, when the first semiconductor layer 31 is formed as the SiGe buffer layer according to the present invention, there is presented a difference stress of approximately $5.8 \times 10^{-5}$ (N/μm$^2$) as shown in FIG. 9A. Thus, it is to be understood that a stress could be reduced approximately 11%.

Further, it is to be understood that, according to the method of the present invention, the difference stress could be reduced also in the points B and C at which the SiGe polycrystalline layer is formed.

Therefore, it is to be understood that, according to the method of the present invention, since this stress is reduced, the misfit which is to be caused by this stress could be improved.

Figure 10:
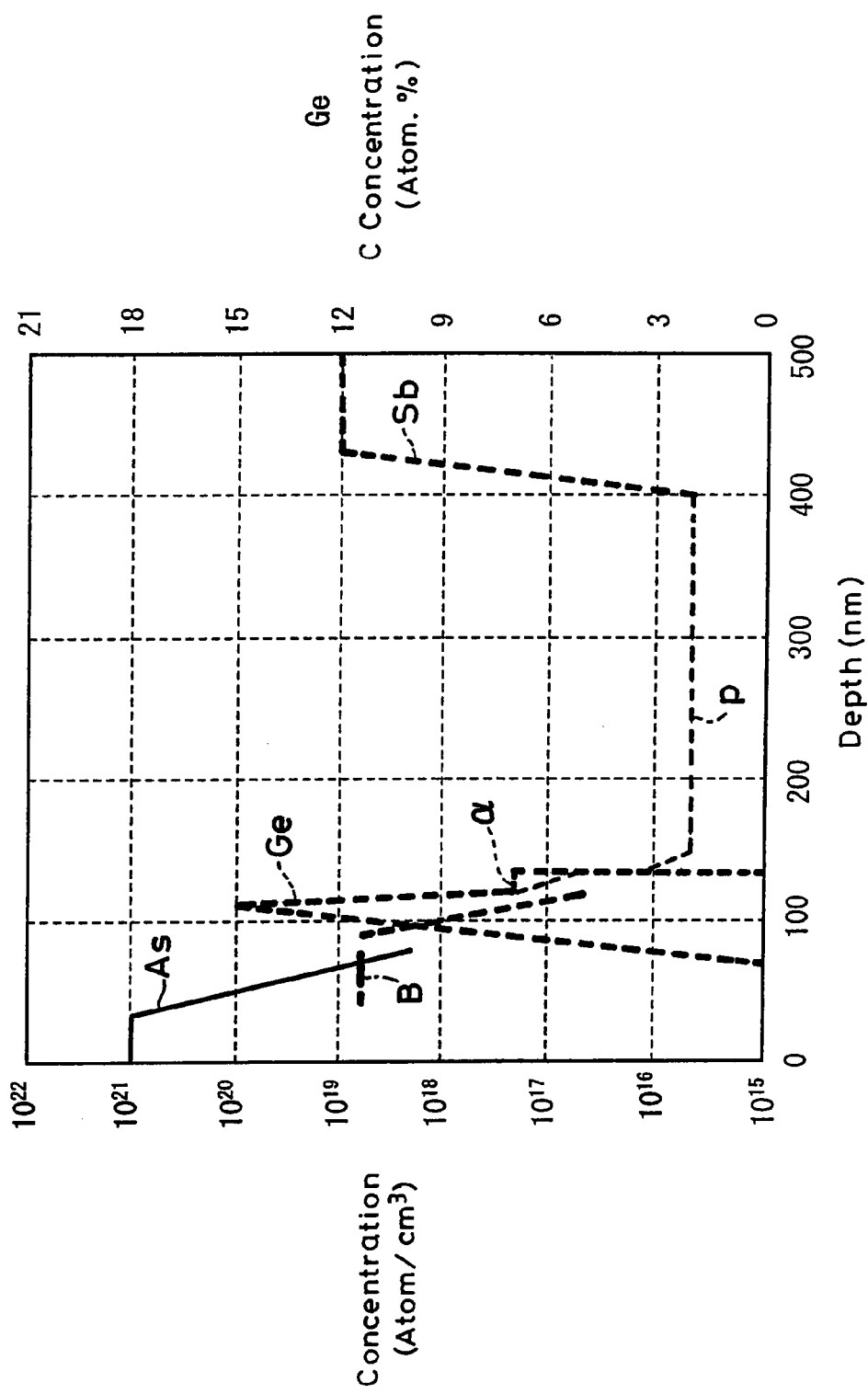
FIG. 10 is a diagram showing an impurity concentration of the depth direction of a semiconductor layer according to the method of the present invention and a Ge concentration distribution.

FIG. 10 shows distributions of respective impurity concentrations and Ge concentrations relative to the depth direction (horizontal axis) in the laminating semiconductor layer 3 in which the first semiconductor layer 31 according to the second method of the present invention is formed of the SiGe layer.

Also in FIG. 10, the left-hand side vertical axis represents respective impurity concentrations and the right-hand side vertical axis represents Ge concentrations.

A terrace-like portion (shown by α in FIG. 10) on the right of the peak of Ge concentration shown in FIG. 10 represents the SiGe buffer layer (semiconductor layer 31).

Figure 11:
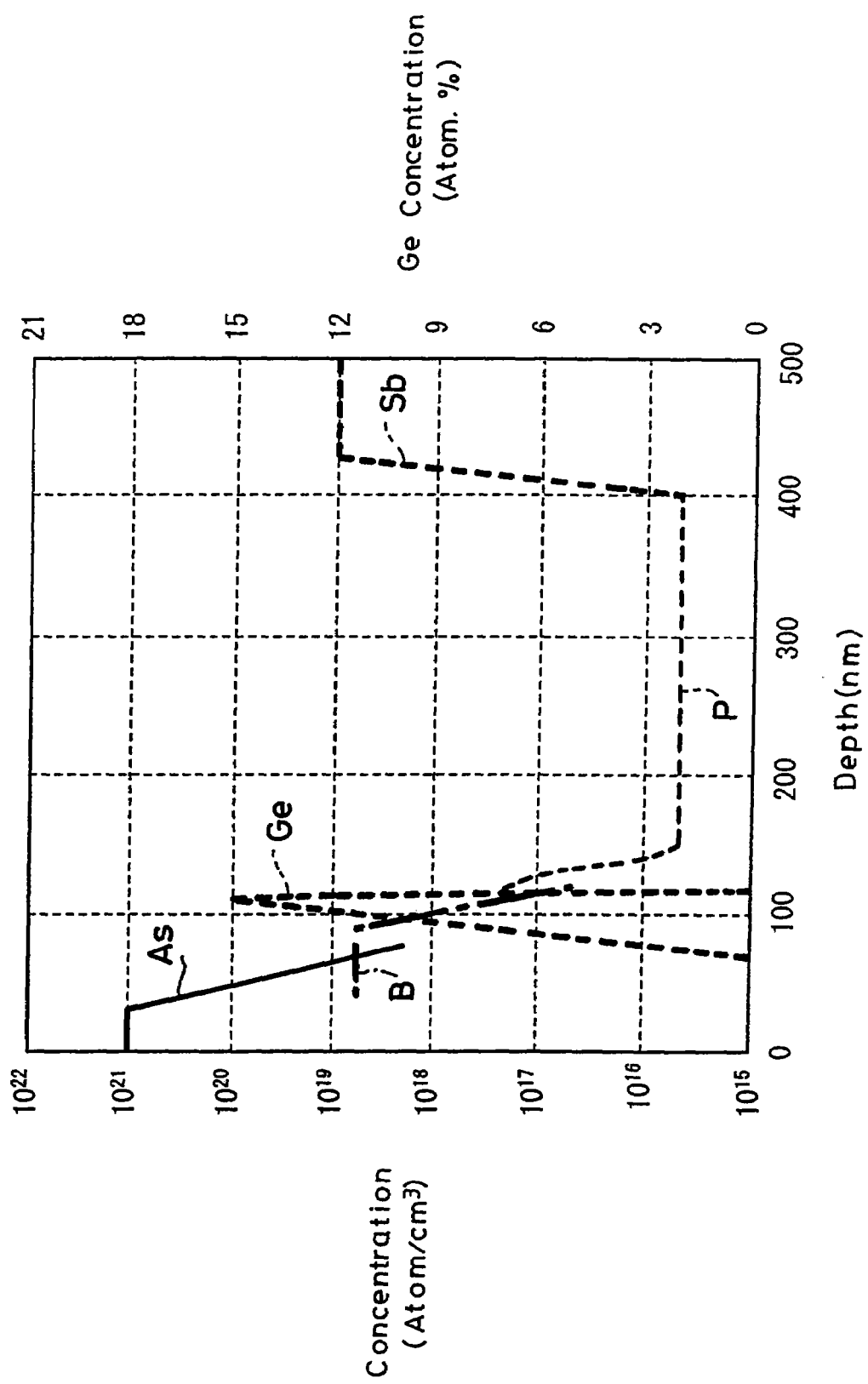
FIG. 11 is a diagram showing an impurity concentration of the depth direction of a semiconductor layer according to the prior-art method and a Ge concentration distribution.

FIG. 11 is a diagram showing a Ge concentration distribution obtained when respective impurities relative to the depth direction (horizontal axis) of the base semiconductor layer in the HBT in which the film deposition method shown in FIG. 16 is applied to the base semiconductor layer are measured. Also in FIG. 11, the left-hand side vertical axis represents respective impurity concentrations and the right-hand side vertical axis represents Ge concentrations.

Further, the above-mentioned coefficients of thermal expansion will be described in detail.

Figure 12A:
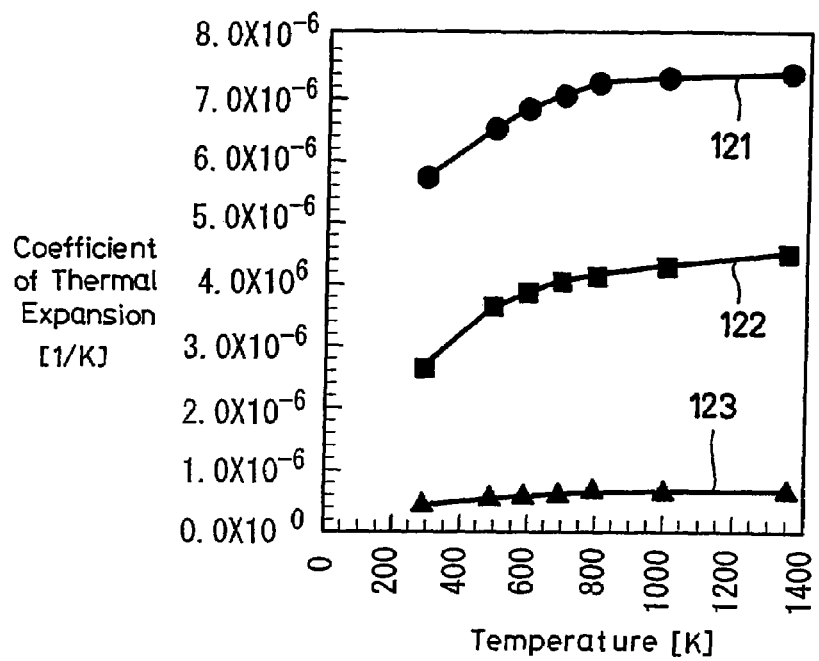
FIGS. 12A and 12B are diagrams showing coefficients of thermal expansion of respective materials.
Figure 12B:
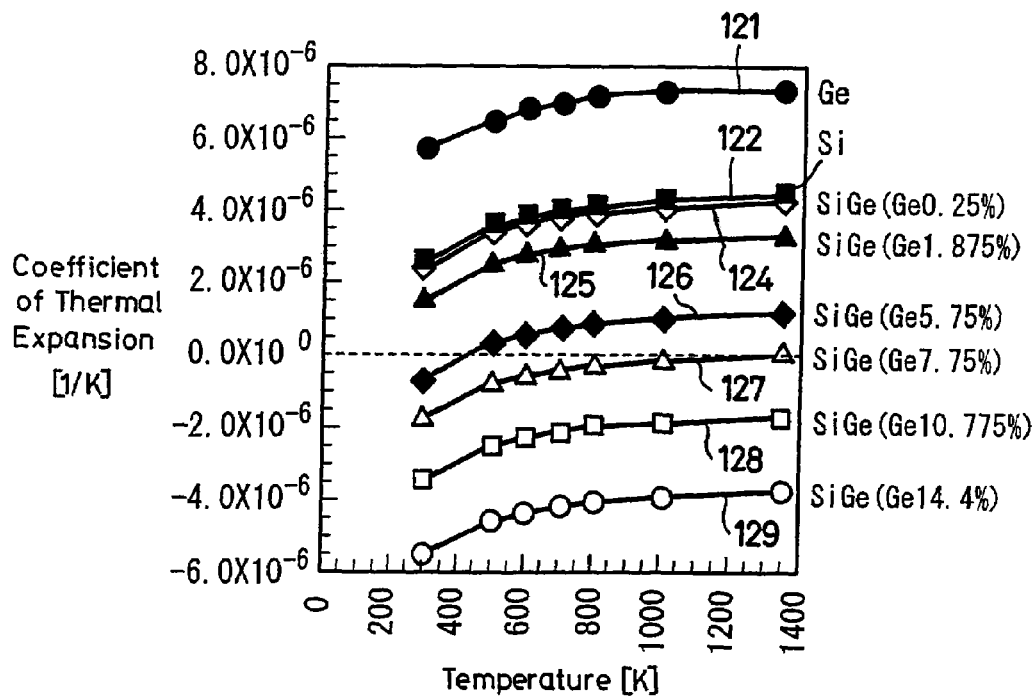
Figure 13:
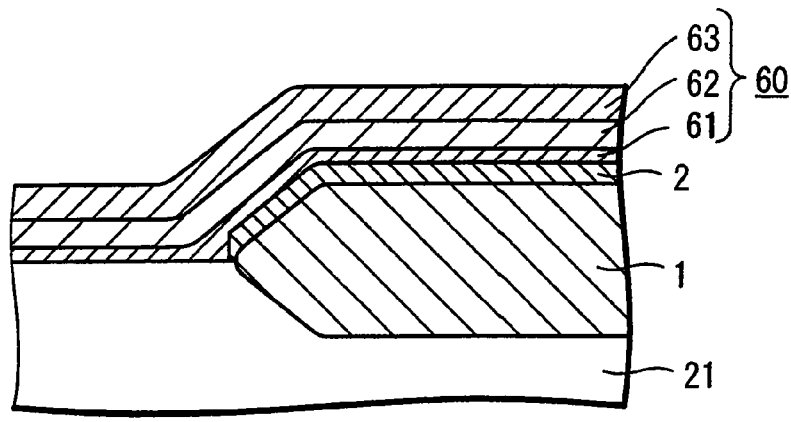
FIG. 13 is a cross-sectional view of a semiconductor layer and to which reference will be made in explaining a method according to the prior art.

In FIGS. 12A and 12B, curves 121 and 122 show temperature dependences of two coefficients of thermal expansion of Ge and Si, respectively. In FIG. 12A, a curve 123 shows a temperature dependence of a similar coefficient of thermal expansion of SiO$_2$-glass.

Curves 124 to 129 in FIG. 12B show temperature dependences of similar coefficients of thermal expansion obtained when Ge concentrations were selected to be 0.25 atom %, 1.875 atom %, 5.75 atom %, 7.75 atom %, 10.775 atom % and 14.4 atom %, respectively.

Then, according to the conventional method, as shown in FIG. 5, after the Si buffer layer has been deposited, when a Ge concentration in the SiGe layer is steeply increased from 0 to 15 atom %, as is clear from FIG. 12, a coefficient of thermal expansion near the room is steeply changed in the negative direction ranging from approximately $+2.5 \times 10^{-6}$ (1/K) (Ge concentration=0, i.e., coefficient of thermal expansion of Si) to approximately $-6.0 \times 10^{-6}$ (1/K) of coefficient of thermal expansion in Ge concentration=14.4%.

In particular, in the polycrystalline SiGe layer deposited on SiO$_2$, since the coefficient of thermal expansion of SiO$_2$ has a value near zero as shown by the curve 123 in FIG. 12A, the steep positive-direction change of the coefficient of thermal expansion between the SiO$_2$ layer and the Si buffer layer is added to the above-mentioned steep change of the coefficient of thermal expansion.

It can be considered that a stress based upon a difference between these coefficients of thermal expansion becomes a factor which causes a misfit dislocation to occur after the SiGe mixed crystal layer has been formed.

However, since it is to be understood from FIG. 12B that the coefficient of thermal expansion becomes a value close to zero in the state in which a Ge concentration is 7.75 atom %, according to the present invention, the SiGe layer in which the above concentration is 7.75 atom % is used as the buffer layer of the first semiconductor layer 31, whereby a coefficient of thermal expansion between the silicon oxide and the SiGe buffer layer (first semiconductor layer 31) can be decreased. Further, in the epitaxial layer, since the Ge concentration is increased from zero in which the concentration of the SiGe buffer layer is 7.75 atom % to 15 atom % of heterodyne, a steep change of a coefficient of thermal expansion can be alleviated.

As a result, according to the present invention, the misfit dislocation can be decreased more as compared with the prior-art method.

[Second Semiconductor Device Manufacturing Method]

In the second semiconductor device manufacturing method according to the present invention, there can be obtained a target semiconductor device with application of the second vapor-phase growth method and the second semiconductor manufacturing method according to the present invention.

[Example of Second Semiconductor Device Manufacturing Method]

In this case, after the semiconductor layer 3 shown in FIG. 1, for example, has been formed by the semiconductor manufacturing method to which the vapor-phase growth method according to the present invention is applied, there can be obtained the target semiconductor device of the HBT by using similar processes to those that have been described so far in the first semiconductor device manufacturing method with reference to FIG. 2.

In the HBT according to the present invention, since its base semiconductor layer is manufactured by the second vapor-phase growth method and the second semiconductor manufacturing method according to the present invention, the misfit dislocation can be improved, the withstanding high pressure can be improved and the yield can be improved.

As described above, according to the respective vapor-phase growth methods of the present invention, in the semiconductor layer including the SiGe layer, there can be carried out the vapor-phase growth in which the misfit dislocation can be decreased considerably.

Further, according to the semiconductor manufacturing method of the present invention, there can be formed the semiconductor of excellent quality in which the misfit dislocation can be decreased.

Furthermore, according to the semiconductor device manufacturing method of the present invention, since the misfit dislocation can be decreased, the withstanding high pressure can be improved and the yield can be improved in the semiconductor layer comprising this semiconductor device, e.g., in the base layer of the HBT, mass-productivity can be improved and costs can be decreased.

The invention claimed is:

1. A vapor-phase growth method in which a semiconductor layer is deposited on an active region as an epitaxial layer and is deposited on a separation silicon oxide layer as a polycrystalline layer in a vapor-phase growth process in which a silicon-germanium mixed crystal layer is deposited on a semiconductor substrate of a single crystal silicon substrate across said active region exposed to said single crystal silicon substrate surface and said separation silicon oxide layer for separating said active region, said vapor-phase growth method comprising the steps of:

a first step of introducing silicon raw material gas and germanium raw material gas into a reaction furnace to thereby form a first semiconductor layer of a silicon-germanium mixed crystal film on said single crystal substrate surface;

a second step of introducing silicon raw material gas and germanium raw material gas into said reaction furnace to thereby form a second semiconductor layer of a silicon-germanium mixed crystal layer; and a third step of introducing silicon raw material gas into said reaction furnace to thereby form a third semiconductor layer of a silicon layer, wherein, a laminated semiconductor layer structure formed by said first, second and third steps is deposited on a portion formed on an active region exposed to said single crystal silicon substrate surface as a single crystal semiconductor layer and is deposited on a portion formed on said separation silicon oxide layer as a polycrystalline semiconductor layer.

2. A vapor-phase growth method according to claim 1, wherein a germanium concentration in said epitaxial layer of said first semiconductor layer deposited at said first step falls within a range of 7+/−2 atom % and a germanium concentration is made constant with respect to the thickness direction of said epitaxial layer.

3. A vapor-phase growth method according to claim 1, wherein said epitaxial layer of said first semiconductor layer deposited at said first step has a film thickness ranging from 5 nm to 30 nm.

4. A vapor-phase growth method according to claim 1, wherein said laminating semiconductor layer including said silicon-germanium mixed crystal layer is formed at a temperature ranging from 600° C. to 750° C.

5. A vapor-phase growth method according to claim 1, wherein said second and third steps introduce P type or N type impurities.

* * * * *